United States Patent
Morhard et al.

(10) Patent No.: US 6,544,856 B2
(45) Date of Patent: Apr. 8, 2003

(54) METHOD FOR INCREASING THE TRENCH CAPACITANCE

(75) Inventors: Klaus-Dieter Morhard, Dresden (DE); Irene Sperl, Dresden (DE); Klaus Penner, Ottendorf-Okrilla (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/880,180

(22) Filed: Jun. 13, 2001

(65) Prior Publication Data

US 2002/0018377 A1 Feb. 14, 2002

(30) Foreign Application Priority Data

Jun. 13, 2000 (DE) .......................... 100 29 036

(51) Int. Cl.[7] ...................... H01L 21/20; H01L 21/8242
(52) U.S. Cl. ...................... 438/392; 438/243; 438/246; 438/249; 438/386; 438/389
(58) Field of Search ................. 438/392, 249, 438/389, 386, 243, 246

(56) References Cited

U.S. PATENT DOCUMENTS

| 4,999,312 | A | * | 3/1991 | Yoon .......................... 438/392 |
| 5,148,257 | A | * | 9/1992 | Kishi .......................... 257/520 |
| 5,618,751 | A | * | 4/1997 | Golden et al. .............. 438/392 |
| 5,891,807 | A |   | 4/1999 | Muller et al. |
| 6,071,823 | A | * | 6/2000 | Hung et al. ................. 438/714 |
| 6,100,132 | A | * | 8/2000 | Sato et al. ................... 438/243 |
| 6,245,612 | B1 | * | 6/2001 | Chang et al. ............... 438/249 |
| 6,271,079 | B1 | * | 8/2001 | Wei et al. ................... 438/243 |
| 6,316,310 | B1 | * | 11/2001 | Wensley et al. ............ 438/249 |
| 6,365,485 | B1 | * | 4/2002 | Shiao et al. ................ 438/392 |

* cited by examiner

*Primary Examiner*—Matthew Smith
*Assistant Examiner*—Lex H. Malsawma
(74) *Attorney, Agent, or Firm*—Laurence A. Greenberg; Werner H. Stemer; Ralph E. Locher

(57) ABSTRACT

A method for increasing a trench capacitance in deep trench capacitors is described, in which, in a standard method, after the etching of the arsenic glass, a wet-chemical etching is additionally performed. An n+-doped substrate results from the driving-out of the arsenic glass being widened in the trench, by about 20 nm, selectively both with respect to the lightly doped substrate and with respect to the oxide layer and with respect to the nitride layer.

6 Claims, 2 Drawing Sheets

METHOD FOR INCREASING THE TRENCH CAPACITANCE

BACKGROUND OF THE INVENTION

FIELD OF THE INVENTION

The invention relates to a method for increasing a trench capacitance in deep trench capacitors used as memory elements in semiconductor components. The trench has a bottle-shaped widened portion reaching into the depth of the wafer, an oxide layer is situated on a silicon substrate and a nitride layer is situated on the oxide layer. A hard mask is formed in them by a preceding photolithographic steps, the openings in the hard mask determine the position of the trench to be formed. The silicon subsequently is etched down to a first depth in order to form the trench, and afterward a conformal deposition of arsenic glass in the trench is performed. Then the steps of filling the trench with a photoresist, etching the photoresist down to a second, smaller depth, etching the arsenic glass selectively with respect to the photoresist, incinerating the residual photoresist in the trench, driving out the arsenic from the arsenic glass into the surrounding substrate, thereby producing an n+-doped substrate, and also etching the arsenic glass and depositing the node dielectric in the trench and depositing the $n^+$-type poly-silicon are carried out.

Memory elements are usually embodied as capacitors that make it possible to realize particularly small feature sizes. However, such capacitors must satisfy various requirements. These include not only an adequate capacitance but also, in particular, the capability of long-term storage of the information, i.e. the retention time is intended to be as long as possible. It must therefore be ensured that as far as possible no leakage currents, or small leakage currents, flow to adjacent semiconductor structures. Recent publications have disclosed embodying such memory cells as deep trench capacitors. Such capacitors have a relatively low capacitance, which is likewise reduced as the feature size decreases further. However, the lower capacitance aggravates the problems already mentioned, owing to the fact that, in particular, the retention time, i.e. the charge retention time, is shortened.

It has been shown in DRAM development, however, that every structural miniaturization (shrink) also leads to impairment of the retention time. The requirements made of the product remain the same, however. The hitherto sole practically employed possibility for solving this problem consists in increasing the trench capacitance. For this purpose, use was made of the possibility of using a thinner node dielectric. However, distinct limits are exhibited in this case, these being limited by the leakage current through the dielectric.

Better results can be achieved if deep trench capacitors of this type are provided with a bottle-shaped widened portion reaching into the depth of the wafer. This results in a distinct enlargement of the capacitor area and hence an increase in the capacitance. However, the realization of such a bottle-shaped widened portion is relatively complicated, especially because at the same time it must be ensured that shorts to adjacent memory cells cannot be produced, or that the insulation with respect to adjacent structures is still sufficient to keep the leakage currents within limits.

Bottle deep trench capacitors of this type can be fabricated either by dry or wet etching processes with subsequent filling of the etched depression and widening with a node dielectric.

One example of such a capacitor is revealed in U.S. Pat. No. 5,891,807. In this case, an etching mask is produced by exposure and development of a resist, the structure of which mask is subsequently transferred by dry etching, such as reactive ion etching, plasma etching, etc., into a TEOS and an underlying nitride layer, thereby producing a hard mask. Afterward, the bottle-shaped trench is fabricated by anisotropic reactive ion etching in two steps. In other words, an upper region with a slightly beveled wall is realized and the bottle-shaped widening into the depth is realized in a second step. In this case, different recipes or etching parameters are used for the two etching steps by reactive ion etching. By way of example, the second etching step can be carried out using the same etching gases but a different surface temperature of the wafer or reduction of the pressure within the etching chamber.

What is problematic, in every case, is the exact determination of parameters and, in particular, the definition of etching depth parameters in order to ensure that the predetermined etching depths are exceeded. It is also difficult to determine the point in time when the bottle-shaped widening must be ended.

If the second etching step is stopped too early, an adequate increase in capacitance is not achieved. If the second etching step is stopped too late, there is the risk of adequate insulation with respect to adjacent trenches or active regions no longer being present, with the result that an increase in the leakage currents must be expected.

Moreover, it has been shown that when dry etching processes are employed, increased failure of individual memory cells must be expected.

The customary standard process for fabricating a deep trench capacitor contains, after the fabrication of the hard mask, the work steps wherein the silicon is etched down to a depth of 8 μm in order to form a trench and conformal deposition of arsenic glass in the trench is subsequently performed. Afterward, the trench is filled with photoresist and the photoresist is etched down to a depth of 2 μm. The arsenic glass is subsequently etched selectively with respect to the photoresist and the residual photoresist in the trench is incinerated. In order to produce an $n^+$-doped substrate, the arsenic is driven out from the arsenic glass into the surrounding substrate and the arsenic glass in the trench is removed by etching. Finally, the deep trench capacitor is completed by deposition of the node dielectric in the trench and deposition of the $n^+$-type poly-silicon.

SUMMARY OF THE INVENTION

It is accordingly an object of the invention to provide a method for increasing the trench capacitance which overcomes the above-mentioned disadvantages of the prior art methods of this general type, which can be handled in a reliable manner and which makes it possible to achieve an increase in the trench capacitance by at least 15–20% with a low outlay.

With the foregoing and other objects in view there is provided, in accordance with the invention, a method for forming a trench capacitor having an increased trench capacitance forming a memory element of a semiconductor component. The method includes the steps of providing a silicon substrate, applying an oxide layer on the silicon substrate, applying a nitride layer on the oxide layer, and forming a hard mask having an opening formed therein from the nitride layer and the oxide layer using a photolithographic process. The opening determines a position of a trench to be formed. The silicon substrate is etched, through the opening, down to a first depth to form the trench and an arsenic glass is conformally deposited on the trench. The trench is filled with a photoresist and the photoresist is etched down to a second depth being less than the first depth. The arsenic glass is etched selectively with respect to the photoresist. The residual photoresist in the trench is incinerated. The arsenic is driven out from the arsenic glass into the silicon substrate, thereby producing an n+-doped substrate region and then remaining parts of the arsenic glass are etched away. Subsequently a wet-chemical etching of the $n^+$-doped substrate region is performed such that the trench is widened selectively both with respect to the n+-doped substrate region and with respect to the oxide layer and with respect to the nitride layer. A node dielectric is deposited in the trench and a $n^+$-type polysilicon is deposited in the trench on the node dielectric.

The object formulation on which the invention is based is achieved, in the case of a method of the type mentioned in the introduction, by virtue of the fact that after the etching of the arsenic glass, a wet-chemical etching is performed. The $n^+$-doped substrate region resulting from the driving-out of the arsenic glass being widened selectively both with respect to the lightly doped substrate and with respect to the oxide layer and with respect to the nitride layer.

What is achieved with this method is a significantly increased method reliability, since shorts to adjacent active regions or transistors are reliably avoided through the selective etching of the highly $n^+$-doped region, and that, a distinct increase in the trench capacitance by 15–20% is achieved by virtue of the method, which can be realized in a simple manner.

A polysilicon etchant is preferably used for the wet-chemical etching, the etchant contains a mixture of concentrated nitric acid and concentrated hydrofluoric acid. The trench is preferably etched down into a depth of at least 8 µm and the photoresist is etched down into a depth of at least 2 µm and removed. The trenches are widened wet-chemically by about 20 nm.

In order to further improve the selectivity, phosphoric acid and/or acetic acid can be admixed with the polysilicon etchant.

Other features which are considered as characteristic for the invention are set forth in the appended claims.

Although the invention is illustrated and described herein as embodied in a method for increasing the trench capacitance, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
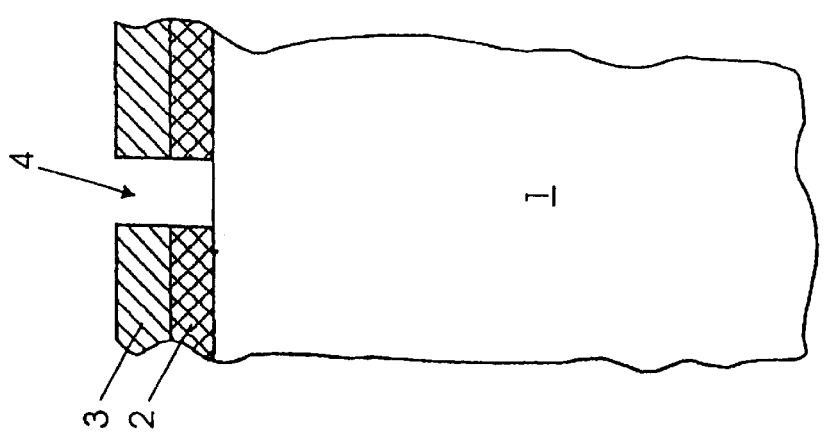
FIG. 1 is a diagrammatic, sectional view of a silicon substrate provided with a hard mask according to the invention.

In all the figures of the drawing, sub-features and integral parts that correspond to one another bear the same reference symbol in each case. Referring now to the figures of the drawing in detail and first, particularly, to FIG. 1 thereof, there is shown a silicon substrate 1 in the case of which, in preparatory steps, an oxide layer 2 and, on the latter, a nitride layer 3 have been applied, in which a so-called hard mask having an opening 4 has been produced by customary photolithography. The opening 4 serves as an etching mask in the subsequent etching steps that are yet to be described. Moreover, further intermediate layers, e.g. ARC layers, i.e. antireflection layers, may be present on the silicon substrate 1.

Figure 2:
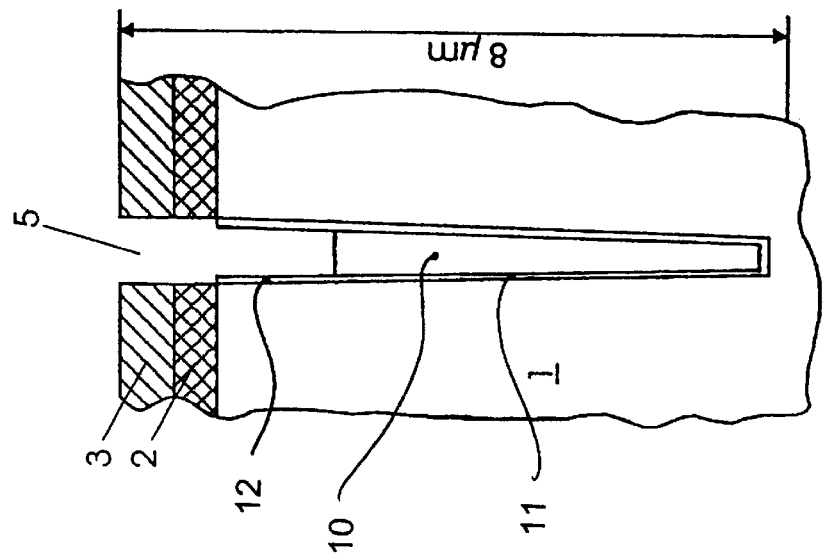
FIG. 2 is a sectional view of the silicon substrate having a trench after the deposition of an arsenic glass in the trench and the trench is filled with a photoresist.

Afterward, a trench 5 can be opened as far as a depth of approximately 8 µm, see FIG. 2. An arsenic glass layer 11 is deposited after the trench 5 has been formed down to a depth of 8 µm. The arsenic glass layer 11 is conformally deposited in the trench 5. Then the trench 5 is filled with a photoresist 10. An upper part 12 of the trench 5 down to a depth of 2 µm is freed of the photoresist 10 by removal of the photoresist 10. Then the upper part 12 of the arsenic glass layer 11, which is not protected by the residual photoresist 10, is etched away. The upper part 12 of the arsenic glass layer 11 is thus selectively etched with respect to the photoresist 10. Finally, a remaining part of the photoresist 10 is incinerated and removed from the trench 5. What remains in the trench 5 is a lower part of the arsenic glass layer 11 having a depth of 2 µm to 8 µm.

Figure 3:
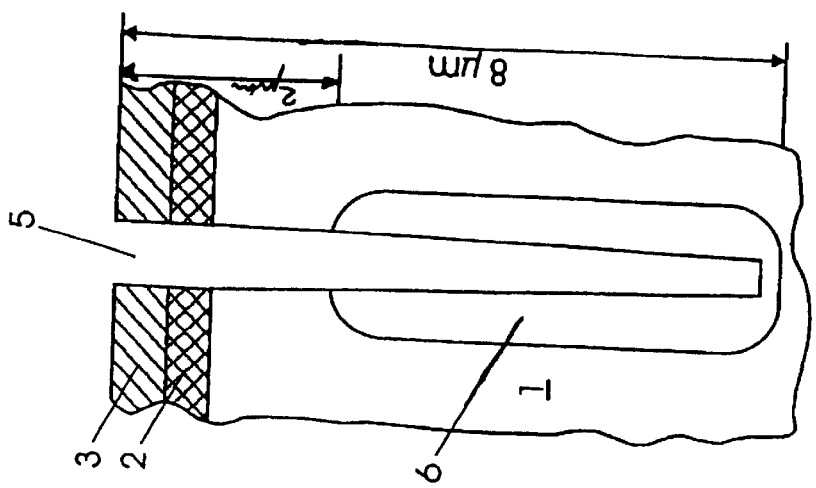
FIG. 3 is a sectional view of the trench after an etching depth has been reached, with a highly n+-doped region formed in the silicon substrate.

The arsenic contained in the remaining part of the arsenic glass layer 11 is then driven into the silicon substrate 1 in order to form a buried plate 6 as shown in FIG. 3. The buried plate 6 can then be produced as a highly $n^+$-doped region 6 in the lower part by diffusion. The buried plate 6 extends from a depth of from 2 µm to 8 µm in the silicon substrate 1. The part of the arsenic glass layer 11 still remaining in the trench 5 is then removed by etching.

In a further etching step, which is now to be carried out as a wet-etching step, etching into the highly $n^+$-doped region 6 can then be effected selectively with respect to the oxide layer 2 and with respect to the nitride layer 3. A polysilicon etchant, containing a mixture of concentrated nitric acid and concentrated hydrofluoric acid, is suitable for this purpose. A further improvement in the selectivity is achieved if phosphoric acid and/or acetic acid are/is admixed with the polysilicon etchant.

Figure 4:
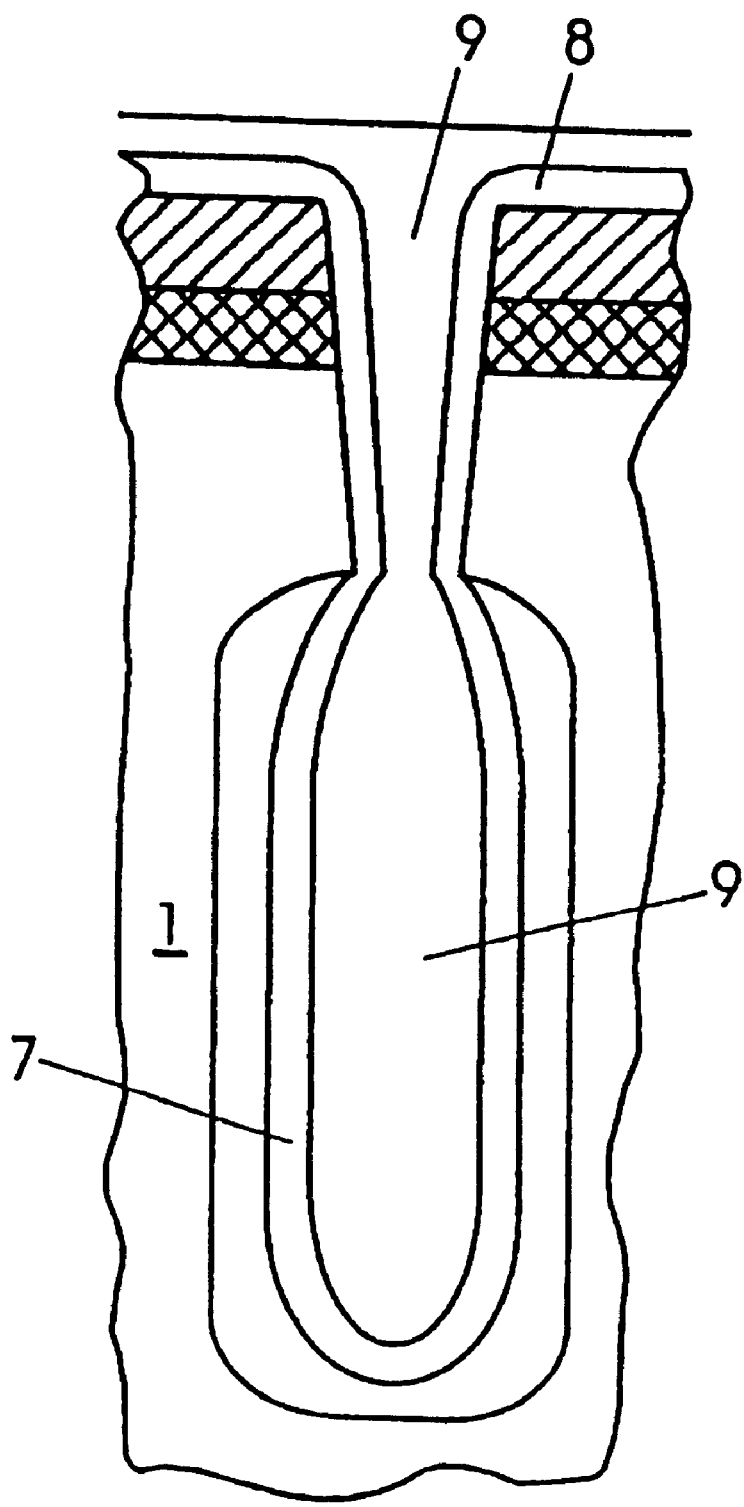
FIG. 4 is a sectional view of the completed trench capacitor with a bottle-shaped widened portion.

By the wet-etching step, a bottle-shaped widening 7 by approximately 20 nm is achieved in the lower region of the trench 5, see FIG. 4. This leads to the desired increase in the capacitance of the trench capacitor by 15 . . . 20%.

After the formation of the bottle-shaped widened portion 7, the trench capacitor is completed by a node dielectric 8 being deposited, after which the trench 5 is then filled with an $n^+$-type polysilicon 9.

We claim:

1. A method for forming a trench capacitor having an increased trench capacitance forming a memory element of a semiconductor component, which comprises the steps of:

providing a silicon substrate;

applying an oxide layer on the silicon substrate;

applying a nitride layer on the oxide layer;

forming a hard mask having an opening formed therein from the nitride layer and the oxide layer using a photolithographic process, the opening determining a position of a trench to be formed;

etching the silicon substrate, through the opening, down to a first depth to form the trench;

depositing conformally an arsenic glass in the trench;

filling the trench with photoresist;

etching the photoresist down to a second depth being less than the first depth;

etching the arsenic glass selectively with respect to the photoresist;

incinerating residual photoresist in the trench;

driving out arsenic from the arsenic glass into the silicon substrate, thereby producing an n+-doped substrate region;

etching remaining parts of the arsenic glass;

subsequently performing a wet-chemical etching widening the $n^+$-doped substrate region selectively both with respect to a lightly doped substrate region and with respect to the oxide layer and the nitride layer;

depositing a node dielectric in the trench; and depositing a $n^+$-type polysilicon in the trench on the node dielectric.

2. The method according to claim 1, which comprises carrying out the wet-chemical etching step using a polysilicon etchant.

3. The method according to claim 2, which comprises forming the polysilicon etchant as a mixture of concentrated nitric acid and concentrated hydrofluoric acid.

4. The method according to claim 2, which comprises admixing at least one of phosphoric acid and acetic acid with the polysilicon etchant.

5. The method according to claim 1, which comprises setting the first depth to be at least 8 $\mu$m and the second depth to be at least 2 $\mu$m.

6. The method according to claim 1, which comprises widening the $n^+$-doped substrate region by about 20 nm due to the wet-chemical etching step.

* * * * *